US009455265B2

(12) United States Patent
Chen (10) Patent No.: US 9,455,265 B2
(45) Date of Patent: Sep. 27, 2016

(54) SEMICONDUCTOR 3D STACKED STRUCTURE AND MANUFACTURING METHOD OF THE SAME

(71) Applicant: MACRONIX INTERNATIONAL CO., LTD., Hsinchu (TW)

(72) Inventor: Shih-Hung Chen, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 76 days.

(21) Appl. No.: 14/091,375

(22) Filed: Nov. 27, 2013

(65) Prior Publication Data
US 2015/0145012 A1    May 28, 2015

(51) Int. Cl.
*H01L 27/115*    (2006.01)
*H01L 29/66*    (2006.01)
*H01L 27/112*    (2006.01)

(52) U.S. Cl.
CPC ... *H01L 27/11578* (2013.01); *H01L 27/11206* (2013.01); *H01L 27/11565* (2013.01); *H01L 29/66833* (2013.01)

(58) Field of Classification Search
CPC .................. H01L 27/11578; H01L 27/11565; H01L 21/764
See application file for complete search history.

(56) References Cited

U.S. PATENT DOCUMENTS

| 8,503,213 B2 | 8/2013 | Chen et al. |
| 9,129,830 B2 | 9/2015 | Baek et al. |
| 2012/0068241 A1* | 3/2012 | Sakuma et al. ............... 257/314 |
| 2012/0182806 A1* | 7/2012 | Chen ................. H01L 27/11573 365/185.17 |
| 2013/0181184 A1* | 7/2013 | Sakuma .......... H01L 21/823431 257/5 |

FOREIGN PATENT DOCUMENTS

| TW | 201232554 | 8/2012 |
| TW | 201250992 A1 | 12/2012 |

OTHER PUBLICATIONS

TIPO Office Action dated Sep. 30, 2015 in corresponding Taiwan application (No. 102143345).

* cited by examiner

*Primary Examiner* — Allen Parker
*Assistant Examiner* — Stephen Bradley
(74) *Attorney, Agent, or Firm* — McClure, Qualey & Rodack, LLP (57) ABSTRACT

A semiconductor structure is provided. The semiconductor structure includes a first stacked structure. The first stacked structure includes a first stacked portion disposed along a first direction, at least one second stacked portion connected with the first stacked portion and disposed along a second direction perpendicular to the first direction, and at least one third stacked portion connected with the first direction and arranged alternately with the second stacked portion along the first direction. The width of the third stacked portion is smaller than the width of the second stacked portion along the second direction.

13 Claims, 10 Drawing Sheets

SEMICONDUCTOR 3D STACKED STRUCTURE AND MANUFACTURING METHOD OF THE SAME

BACKGROUND

1. Technical Field

The disclosure relates in general to a semiconductor structure and manufacturing method of the same, and more particularly to a high density semiconductor structure and manufacturing method of the same.

2. Description of the Related Art

Memory devices are used in storage elements for many products such as MP3 players, digital cameras, computer files, etc. As the application increases, the demand for the memory device focuses on small size and large memory capacity. For satisfying the requirement, a memory having a high element density is need.

Designers develop a method for improving a memory device density, using 3D stack memory device so as to increase a memory capacity and decrease a cost per cell. It is desirable to provide a structure for three-dimensional integrated circuit memory with a low manufacturing cost, including reliable, very small memory elements and improved process window associated with neighboring stacks of memory cell strings having gate structures.

SUMMARY

The disclosure is directed to a semiconductor structure and a manufacturing method of the same. The manufacturing method is simple and the product formed by the manufacturing method has better stability.

According to one embodiment, a semiconductor structure is provided. The semiconductor structure includes a first stacked structure. The first stacked structure includes a first stacked portion disposed along a first direction, at least one second stacked portion connected with the first stacked portion and disposed along a second direction perpendicular to the first direction, and at least one third stacked portion connect with the first direction and arranged alternately with the second stacked portion along the first direction. The width of the third stacked portion is smaller than the width of the second stacked portion along the second direction.

According to one embodiment, a semiconductor structure is provided. The semiconductor structure includes a first stacked structure and a second stacked structure. The first stacked structure includes a first stacked portion, at least one second stacked portion perpendicular to the first stacked portion, and at least one third stacked portion perpendicular to the first stacked portion and arranged alternately with the second stacked portion. The second stacked structure includes a fourth stacked portion parallel with the first stacked portion, at least one fifth stacked portion perpendicularly connected with the fourth stacked portion and corresponding to the third stacked portion, and at least one sixth stacked portion perpendicularly connected with the fourth stacked portion and corresponding to the second stacked portion.

According to one embodiment, a method for manufacturing a semiconductor structure is provided. The method includes the following steps. Semiconductor layers and insulating layers are alternately stacked, such that the semiconductor layers are separated from each other by the insulating layers. The semiconductor layers and the insulating layers are patterned to form a base stacked structure, wherein the base stacked structure includes at least one first through hole. The first through hole is filled with conductive materials. The base stacked structure is etched to form a first stacked structure and a base conductive line, wherein the first stacked structure comprises a first stacked portion disposed along a first direction, at least one second stacked portion perpendicular to the first stacked portion, and at least one third stacked portion perpendicular to the first stacked portion and arranged alternately with the second stacked portion. The width of the third stacked portion is smaller than the width of the second stacked portion along the second direction. A dielectric element is formed on the first stacked structure. A part of the base conductive line is etched to form at least one second through hole and at least one first conductive line, such that the first conductive line is disposed on one end of the second stacked portion. A plurality of second conductive lines and conductive islands are formed on the first stacked structure. An interval is formed between two of the adjacent conductive islands, such that the two conductive islands are separated with each other.

The above and other aspects of the disclosure will become better understood with regard to the following detailed description of the non-limiting embodiment(s). The following description is made with reference to the accompanying drawings.

BRIEF DESCRIPTION OF THE DRAWINGS

FIGS. 2 to 9B illustrate a process for manufacturing a semiconductor structure in one embodiment according to the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

The embodiments are described in details with reference to the accompanying drawings. The identical elements of the embodiments are designated with the same reference numerals. Also, it is important to point out that the illustrations may not be necessarily be drawn to scale, and that there may be other embodiments of the present disclosure which are not specifically illustrated. Thus, the specification and the drawings are regard as an illustrative sense rather than a restrictive sense.

Figure 1A:
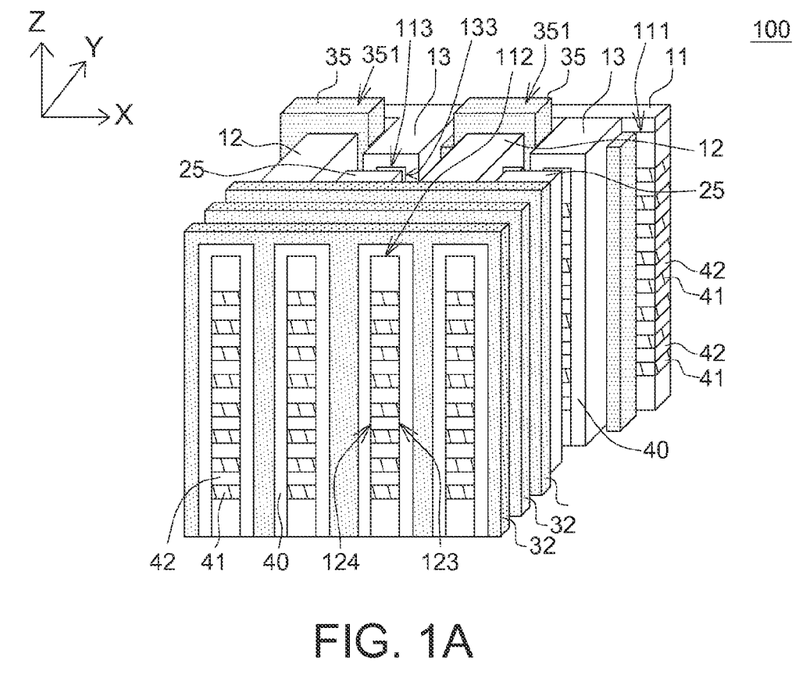
FIG. 1A illustrates a three dimensional view of a part of a semiconductor structure in one embodiment according to the disclosure.
Figure 1B:
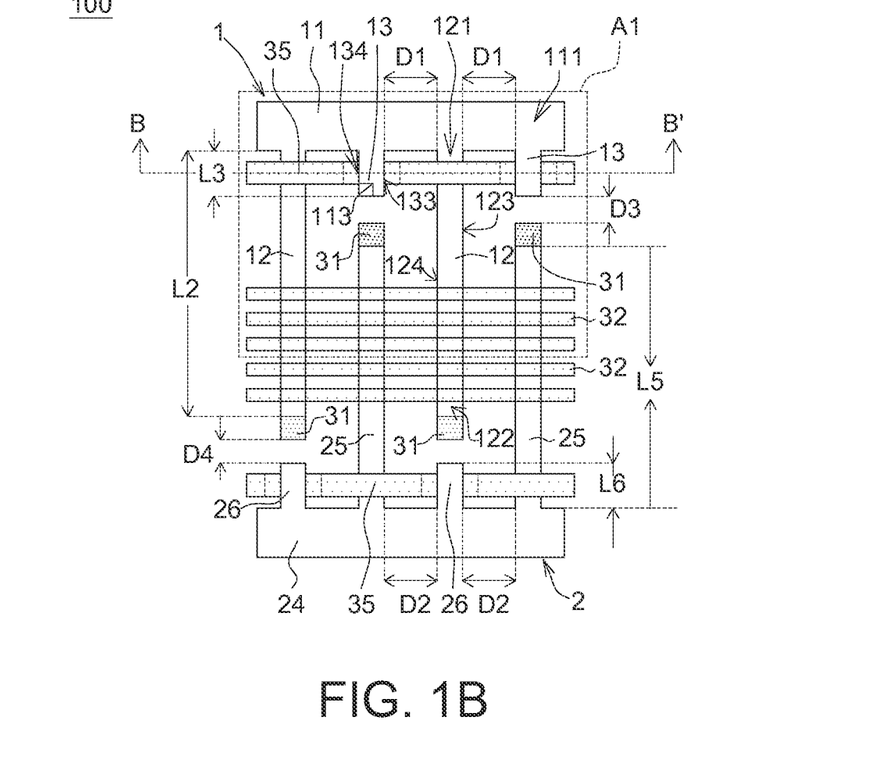
FIG. 1B illustrates a top view of a semiconductor structure in one embodiment according to the disclosure.

FIG. 1A illustrates a three dimensional view of a part of a semiconductor structure 100 in one embodiment according to the disclosure. FIG. 1B illustrates a top view of a semiconductor structure 100 in one embodiment according to the disclosure. In order to facilitate understanding of the technical contents of the disclosure, FIG. 1A illustrates a three dimensional view of the part of the semiconductor structure 100 in area A1 in FIG. 1B.

As shown in FIGS. 1A and 1B, the semiconductor structure 100 in one embodiment of the disclosure includes a first stacked structure 1 and a second stacked structure 2. The first stacked structure includes a first stacked portion 11 disposed along a first direction, at least one second stacked portion 12 connected with the first stacked portion 11 and disposed along a second direction perpendicular to the first direction, and at least one third stacked portion 13 connect with the first direction and arranged alternately with the second stacked portion 12 along the first direction. In this embodiment, the first direction is along the X-direction, and the second direction is along the Y-direction. That is, the second stacked portion 12 and the third stacked portion 13 are perpendicular to the first stacked portion. As shown in the figures, the width L3 of the third stacked portion 13 is smaller than the width L2 of the second stacked portion along the second direction.

In this embodiment, the first stacked structure 1 includes a plurality of second stacked portions 12 and third stacked portions 13. These second stacked portions 12 and third stacked portions 13 have a first interval D1 along the first direction. That is, the intervals between the second stacked portions 12 and third stacked portions 13 are the same.

In one embodiment, the second stacked portion 12 includes a first end 121 connected with the first stacked portion and a second end 122 opposite to the first end 121. The semiconductor structure 100 can also include at least one first conductive line 31 disposed on the second end 122 of the second stacked portion 12.

In this embodiment, the semiconductor structure 100 further includes a second stacked structure 2 facing the first stacked structure 1. The second stacked structure 2 is similar to the first stacked structure 1. The second stacked structure includes a fourth stacked portion 24 disposed along the first direction (X-direction), at least one fifth stacked portion 25 connected with the fourth stacked portion 24 and disposed along the second direction (Y-direction), and at least one sixth stacked portion 26 connected with the fourth stacked portion 24 and arranged alternately with the fifth stacked portion 25 along the first direction. That is, the fourth stacked portion 24 is parallel with the first stacked portion 11, and the fifth stacked portion 25 and the sixth stacked portion 26 are perpendicular to the fourth stacked portion 24.

Similarly to the first stacked structure 1, the width L6 of the sixth stacked portion 26 of the second stacked structure 2 is smaller than the width L5 of the fifth stacked portion 25 of the second stacked structure 2 along the second direction. In one embodiment, at least one of the first conductive lines 31 may be disposed on one end of the fifth stacked portion 25. A second interval D2 between the fifth stacked portion 25 and the sixth stacked portion 26 is substantially the same as the first interval D1.

It should be noted that in order to see the internal structure of the semiconductor structure 100 more clearly, FIG. 1A illustrates only a part of the second stacked structure 2. As shown in FIG. 1B, the filth stacked portion 25 corresponds to the third stacked portion 13, while the sixth stacked portion 26 corresponds to the second stacked portion 12 in this embodiment. In one embodiment, a third interval D3 between the first conductive line 31 and the third stacked portion 13 is substantially the same as a fourth interval D4 between the first conductive line 31 and the sixth stacked portion 26. Since the second stacked structure 2 has a similar structure as the first stacked structure 1, the following description is based on the first stacked structure 1.

In one embodiment, the semiconductor structure 100 further includes a dielectric element 40 formed on the first stacked portion 11, the second stacked portion 12, and the third stacked portion 13. Similarly, the dielectric element 40 may be formed on the fourth stacked portion 24, the fifth stacked portion 25, and the sixth stacked portion 26.

In this embodiment, the first stacked portion 11 includes a first upper surface 111, the second stacked portion 12 includes a second upper surface 112, a first side surface 123 and a second side surface 124 opposite to the first side surface 123, and the third stacked structure 13 includes a third upper surface 113, a third side surface 133 and a fourth side surface 134 opposite to the third side surface 133. The third side surface 133 faces the second side surface 124, and the fourth side surface 134 faces the first side surface 123. The dielectric element 40 is disposed on the first upper surface 111 the second upper surface 112, the third upper surface 113 the first side surface 123, the second side surface 124, the third side surface 133 and the fourth side surface 134.

The dielectric element 40 may have a single dielectric material. In one embodiment, the dielectric element 40 acts as an anti-fuse memory layer and is constructed by an anti-fuse material, for example, comprising oxide such as silicon oxide, or nitride such as silicon nitride. In another embodiment, the dielectric element 40 has a multi-layer structure constructed by various dielectric materials (oxide such as silicon oxide, or nitride such as silicon nitride), for example, an ONO multi-layer structure. In one embodiment, the dielectric element 40 may act as a charge storage layer. In another embodiment, the dielectric element 40 has an ONONO multi-layer structure, and may acts as a charge storage layer or a tunneling dielectric layer.

Figure 1C:
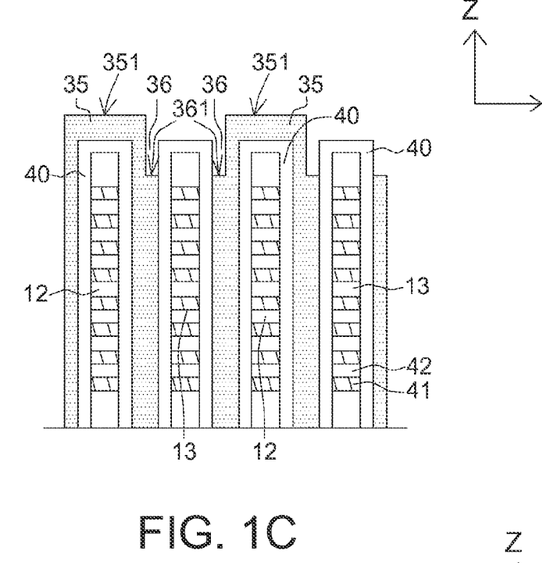
FIG. 1C illustrates a cross-sectional view of the semiconductor structure along B-B' line in FIG. 1B.

FIG. 1C illustrates a cross-sectional view of the semiconductor structure 100 along B-B' line in FIG. 1B. Referring to FIGS. 1A-1C, the semiconductor structure 100 of one embodiment according to the disclosure may include a plurality of conductive islands 35 disposed on the dielectric element 40. In this embodiment, the conductive islands 35 may be disposed between the second stacked portion 12 and the third stacked portion 13. In more detail, the conductive islands 35 may be disposed on the second upper surface 112, the first side surface 123, the second side surface 124, the third side surface 133 and the fourth side surface 134. The upper surfaces 351 of the conductive islands 35 are aligned with each other, and the adjacent two conductive islands 35 are separated with each other. Similarly, the conductive islands 35 may be disposed between the fifth stacked portion 25 and the sixth stacked portion 26 of the second stacked structure 2.

In this embodiment, the conductive islands 35 comprise a plurality of concaves 36. The upper surfaces 361 of the concaves 36 are aligned with each other. The two adjacent conductive islands 35 may be separated from each other by the concaves 36. However, the disclosure does not be limited thereto. In one embodiment, a part of the conductive islands 35 may be disposed on the third upper surface 113 (not shown). In more detail, the part of the conductive islands 35 may be disposed on the dielectric element 40 on the third upper surface 113, but the two adjacent conductive islands 35 may still be separated from each other. That is, there may be an interval between the two adjacent conductive islands 35 on the third upper surface 113, such that the two adjacent conductive islands 35 may not contact each other.

Besides, the conductive islands 35 disposed on both sides of the third stacked portion 13 may be insulated from each other by the third stacked portion 13. In more detail, the conductive islands 35 disposed on the third side surface 133 and the fourth side surface 134 may be insulated from each other by the dielectric element 40 on the third stacked portion 13. Similarly, the conductive islands 35 disposed on both sides of the sixth stacked portion 26 may be insulated from each other by the dielectric element 40 on the sixth stacked portion 26.

In one embodiment, the semiconductor structure 100 may include at least one second conductive line 32 disposed on the second stacked portion 12 and the fifth stacked portion 25. In more detail, the second conductive line 32 may be disposed on the dielectric element 40 on the second stacked portion 12 and the fifth stacked portion 25.

In this embodiment, the first stacked structure 1 and the second stacked structure 2 include semiconductor strips 41 and insulating strips 42 stacked alternately, and the semiconductor strips 41 are separated from each other by the insulating strips 42.

Besides, in the embodiments according to the disclosure, the semiconductor strips 41 of different layers may act as bit lines (BL) of memory cells of different planes, the first conductive line may act as pads of the bit lines (BL), the second conductive line may act as word lines (WL), and the conductive islands 35 may act as string selection lines (SSL).

Figure 2:
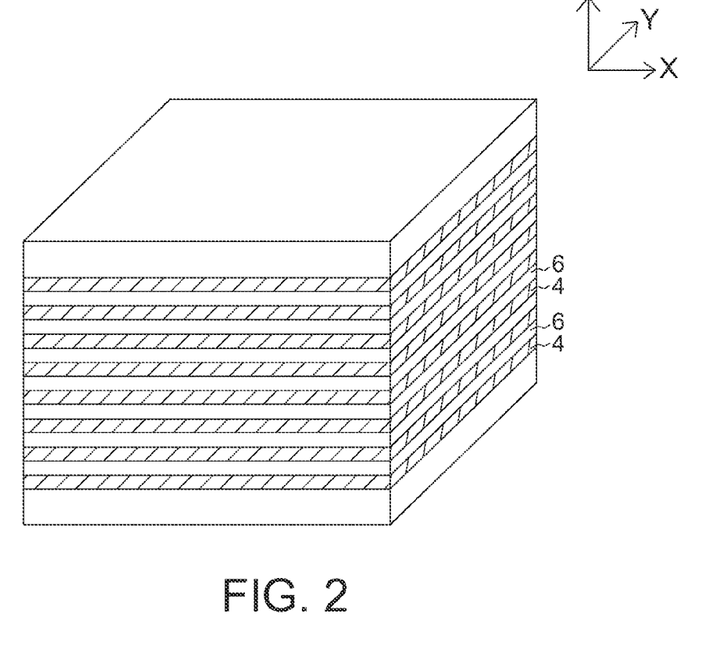
Figure 3A:
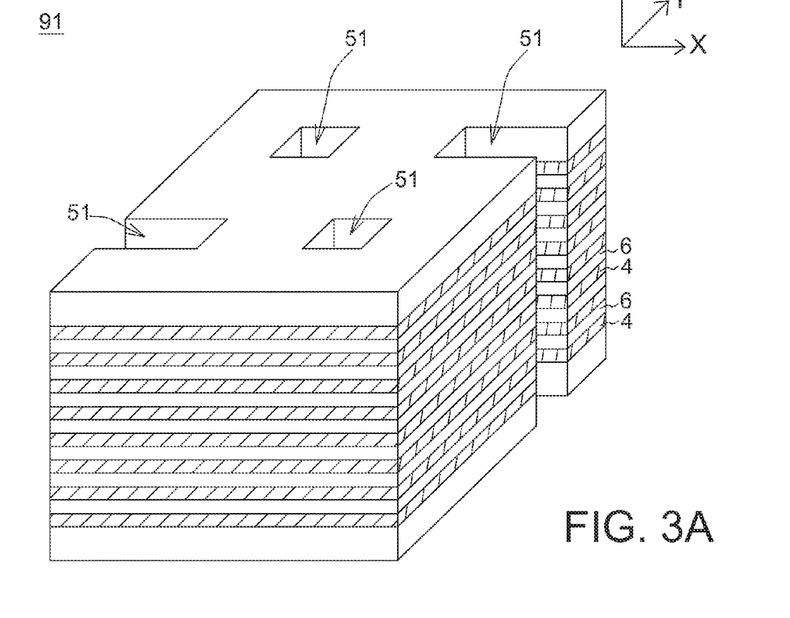
Figure 3B:
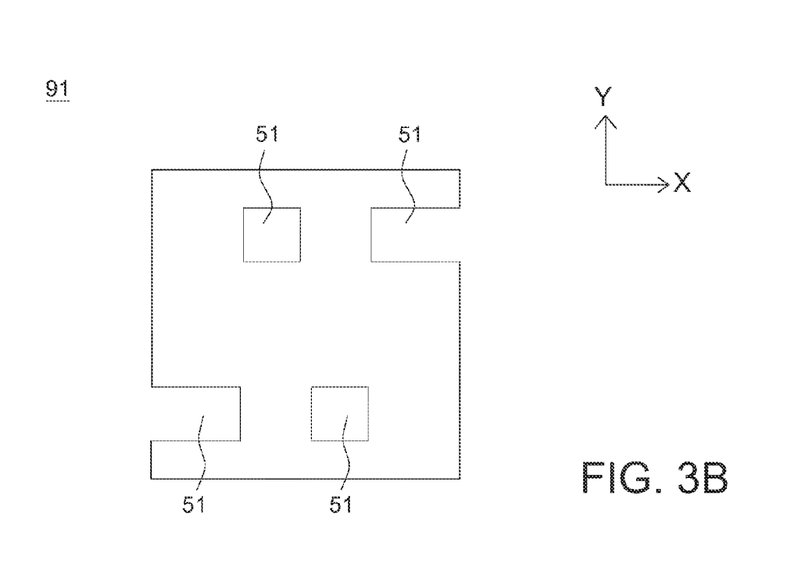

FIGS. 2 to 9B illustrate a process for manufacturing a semiconductor structure 100 in one embodiment according to the disclosure. Referring to FIG. 2, semiconductor layers 4 and insulating layers 6 are alternately stacked, such that the semiconductor layers 4 are separated from each other by the insulating layers 6. The semiconductor layers 4 include polysilicon. In one embodiment, the semiconductor layers 4 may be annealed after a doping process. The semiconductor layers 4 may also include a metal. The insulating layers 6 include an oxide. Then, the semiconductor layers 4 and the insulating layers 6 are patterned to form a base stacked structure 91 as illustrated in FIGS. 3A and 3B. FIG. 3B illustrates the top view of the base stacked structure 91 in FIG. 3A. The base stacked structure 91 includes at least one first through hole 51. The patterning method includes a photolithography process.

Figure 4A:
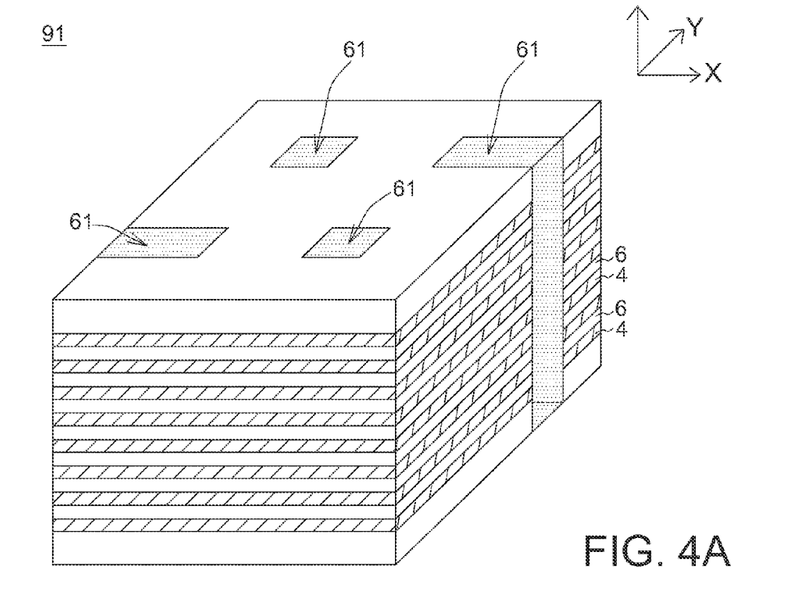
Figure 4B:
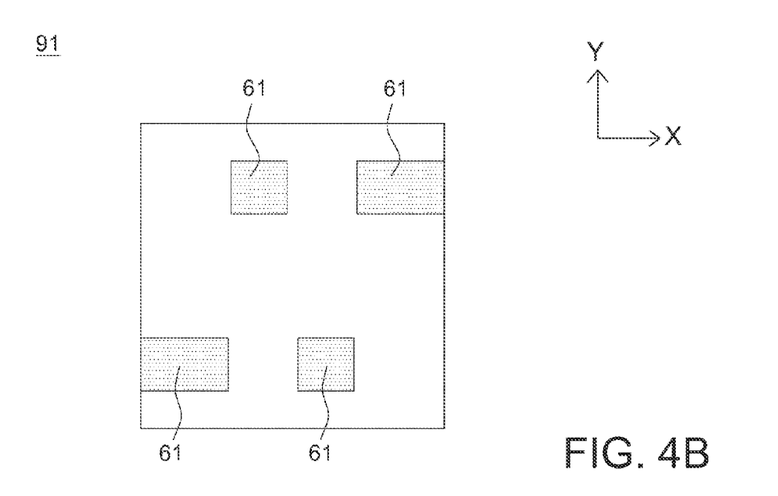

FIG. 4B illustrates the top view of the base stacked structure 91 in FIG. 4A. As shown in FIGS. 4A and 4B, the first through hole 51 is filled with conductive materials 61. The conductive materials 61 may include polysilicon, for example, the conductive materials 61 may be n+ polysilicon for n-channel, or p+ polysilicon for p-channel.

Figure 5A:
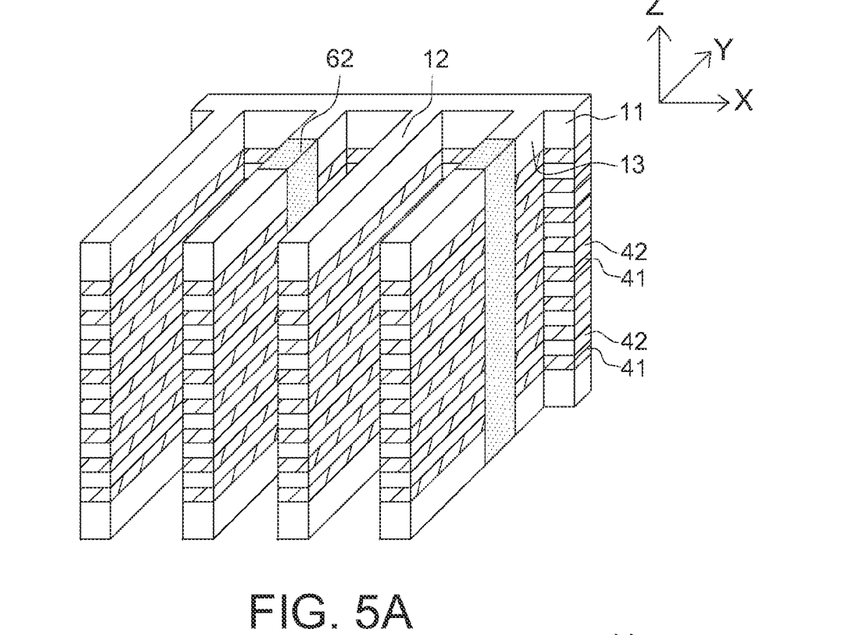
Figure 5B:
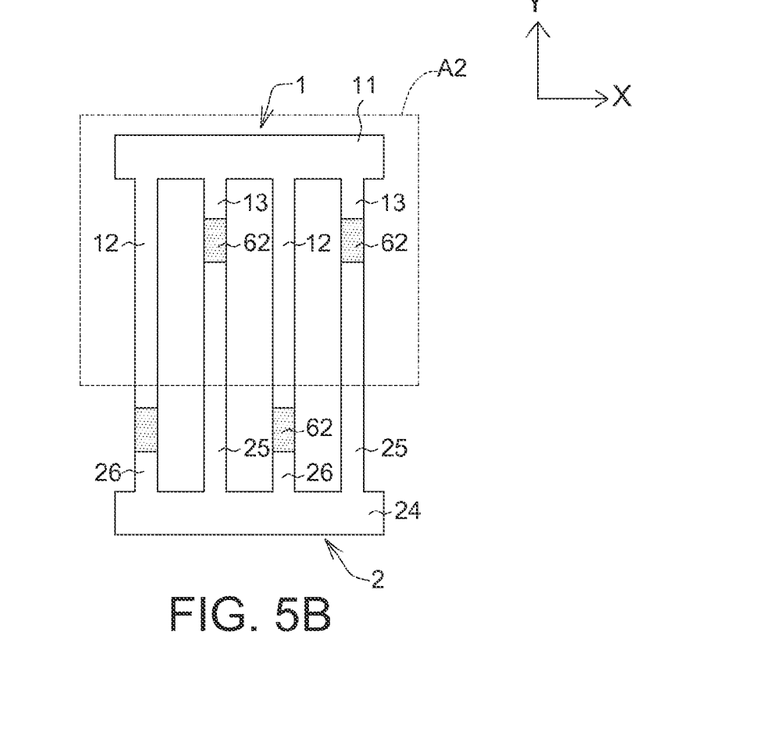

FIG. 5B illustrates the top view of the structure in FIG. 5A. To explaining more clearly, the following 3D view figures are a part of the stacked structure. For example, FIG. 5A illustrated the 3D view of the structure only corresponding to area A2 in FIG. 5B.

Referring FIGS. 5A and 5B, the base stacked structure 91 is etched to form a first stacked structure 1. The first stacked structure 1 includes a first stacked portion 11 disposed along a first direction (such as X-direction), at least one second stacked portion 12 and at least one third stacked portion 13 perpendicular to the first stacked portion 11. The third stacked portion 13 is arranged alternately with the second stacked portion 12.

As shown in FIG. 5B, the first stacked structure 1 and a second stacked structure 2 facing the first stacked structure 1 are formed at the same time. The second stacked structure 2 has a structure similar to the first stacked structure 1. The second stacked structure 2 includes a fourth stacked portion 24, at least one fifth stacked portion 25, and at least one sixth stacked portion 26. Each of the first stacked portion 11, the second stacked portion 12, the third stacked portion 13, the fourth stacked portion 24, the fifth stacked portion 25 and the sixth stacked portion 26 includes semiconductor strips 41 and insulating strips 42 stacked alternately.

Besides, the conductive materials 61 are also etched as at least one base conductive line 62. The base conductive line 62 connects the second stacked portion 12 to the sixth stacked portion 26, and the third stacked portion 13 to the fifth stacked portion 25.

Figure 6:
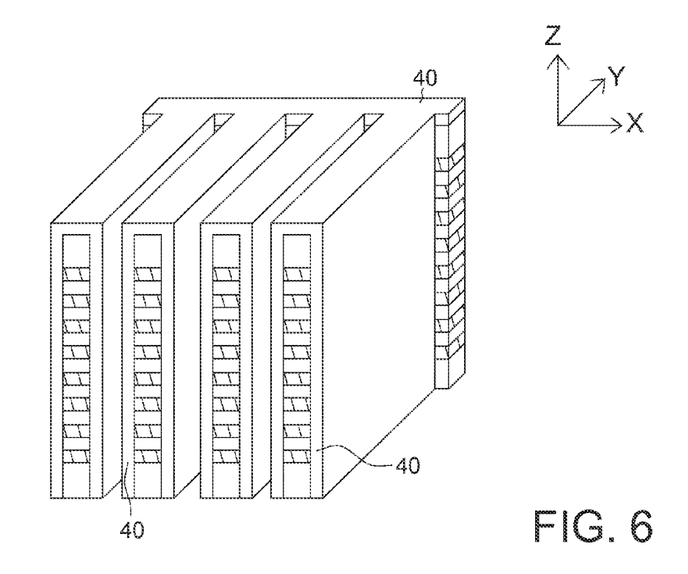
Figure 7A:
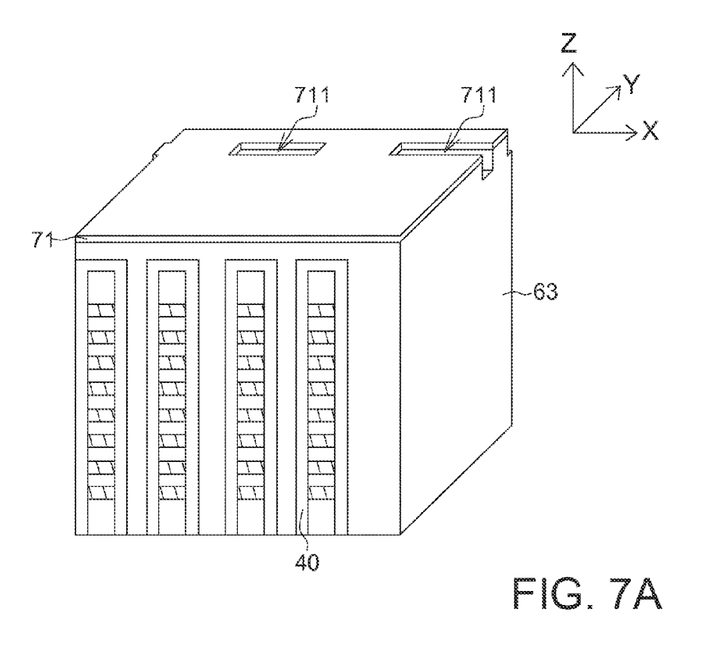
Figure 7B:
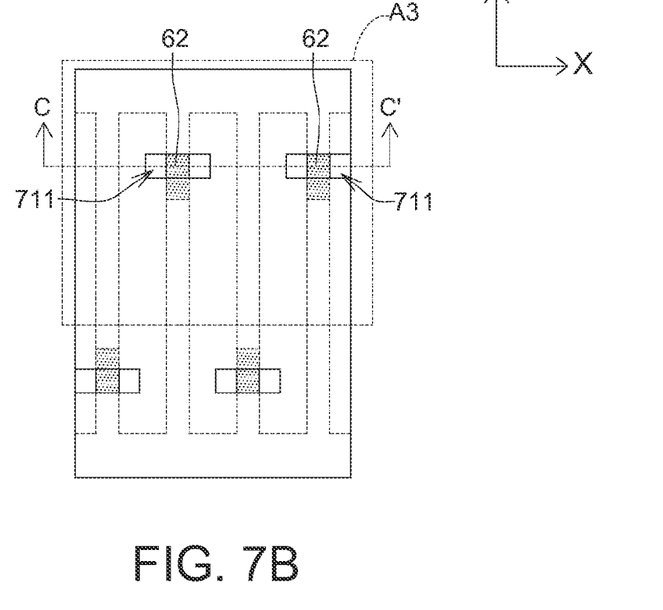

As shown in FIG. 6, a dielectric element 40 is formed on the first stacked structure 1 and the second stacked structure 2. Then, referring to FIGS. 7A and 7B (the dielectric element 40 is omitted in FIG. 7B, and FIG. 7A illustrated the 3D view of the structure only corresponding to area A3 in FIG. 7B), the first stacked structure 1 and the second stacked structure 2 are filled with an organic dielectric material 63. Then, a patterned mask layer 71 including a plurality of openings 711 corresponding to the base conductive line 62 is provided on the organic dielectric material 63.

Figure 7C:
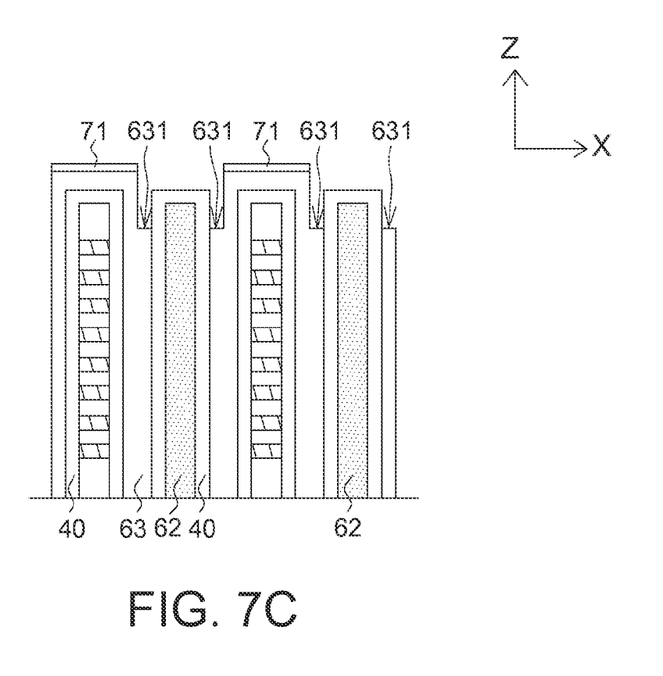

FIG. 7C is a cross-sectional view of the structure along C-C' line in FIG. 7B. As shown in FIG. 7C, a part of the organic dielectric material 63 corresponding to the part of the base conductive line 62 is etched, such that the upper surface 631 of the part of the organic dielectric material 63 are aligned with each other, and a part of the dielectric element 40 on the part of the base conductive line 62 is exposed.

Figure 8A:
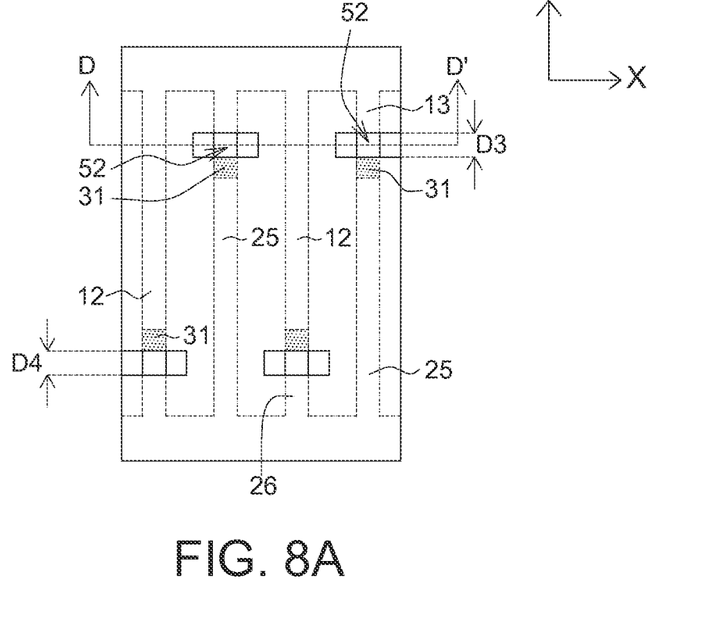
Figure 8B:
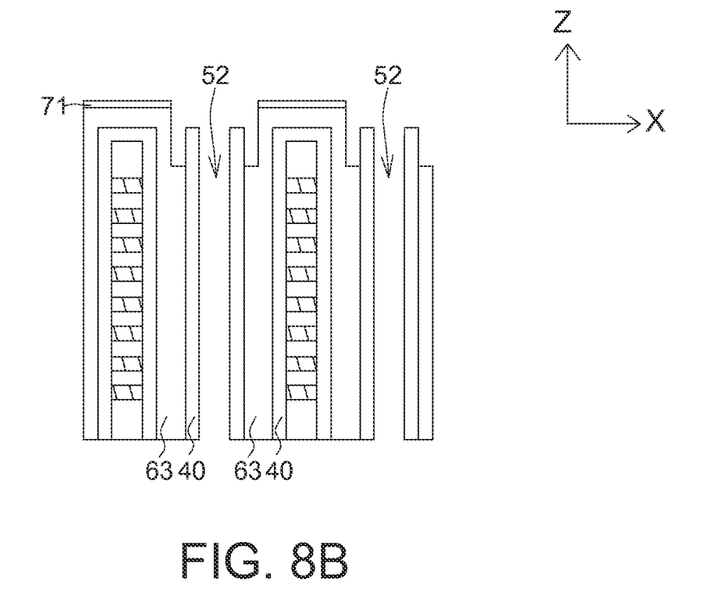

FIG. 8B is a cross-sectional view of the structure along D-D' line in FIG. 8A. As shown in FIGS. 8A and 8B (the dielectric element 40 is omitted in FIG. 8A), the exposed dielectric element 40 and the part of the base conductive line 62 under the dielectric element 40 are etched to form at least one second through hole 52 and at least one first conductive line 31. In one embodiment, an etching gas may be imported to implement an etching process. The etching gas has a great selectivity to etch the dielectric element 40 and the base conductive line 62, but not to etch the organic dielectric material 63, such that the first conductive line 31 may be formed in a predetermined position. After the etching process, the first conductive line 31 is disposed on one end of the second stacked portion 12 or the fifth stacked portion 25. Further, a third interval D3 is formed between the first conductive line 31 and the third stacked portion 13, and a fourth interval D4 is formed between the first conductive line 31 and the sixth stacked portion 26.

Figure 9A:
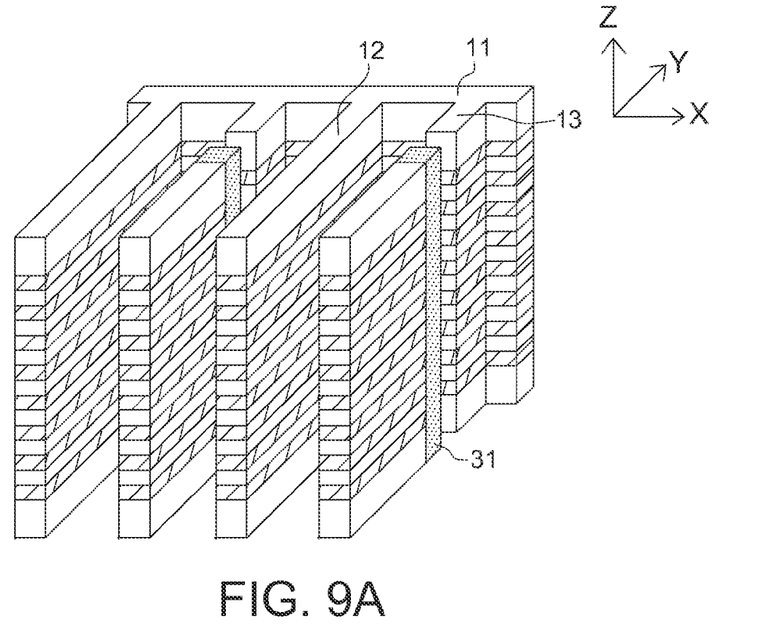
Figure 9B:
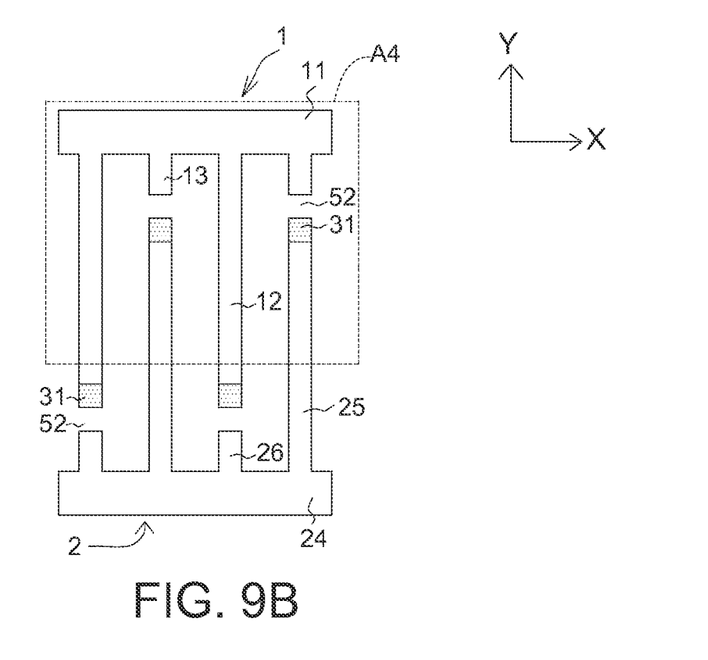

Then, the organic dielectric material 63 and the patterned mask layer 71 are removed. For illustrating more clearly, the dielectric element 40 is omitted in FIGS. 9A and 9B, and FIG. 9A illustrated the 3D view of the structure only corresponding to area A4 in FIG. 9B. It can be shown clearly in FIGS. 9A and 9B about the positions of the first stacked portion 11, the second stacked portion 12, the third stacked portion 13, the fourth stacked portion 24, the fifth stacked portion 25, the sixth stacked portion 26, the first conductive line 31, and the second through hole 52.

At last, a plurality of second conductive lines 32 and conductive islands 35 are formed on the first stacked structure 1 and the second stacked structure 2 to form the semiconductor structure 100 as illustrated in FIG. 1A. The method for forming the plurality of second conductive lines 32 and conductive islands 35 may includes a photolithography process. In one embodiment according to the disclosure, the second conductive lines 32 may be disposed between the second stacked portion 12 and the fifth stacked portion 25. In more detail, the second conductive lines 32 may be disposed on the dielectric element 40 on the second stacked portion 12 and the fifth stacked portion 25. The conductive islands 35 may be disposed between the second stacked portion 12 and the third stacked portion 13. Similarly, the conductive islands 35 may be disposed between the fifth stacked portion 25 and the sixth stacked portion 26. Besides, the upper surfaces 351 of the conductive islands 35 are aligned with each other.

It should be noted that an interval is formed between two of the adjacent conductive islands 35, such that the two conductive islands 35 do not contact with each other. Therefore, it needs one more photolithography process to separate the two conductive islands 35. For example, a plurality of concaves 36 (shown in FIG. 1C) is formed to separate two of the adjacent conductive islands. The upper surfaces 361 of the concaves 36 may be aligned with each other.

Accordingly, the semiconductor structure of one embodiment according to the disclosure includes reliable, very small memory elements and improved process window associated with neighboring stacks of memory cell strings having gate structures. It provides not only an easier manufacturing method but also more stability.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor structure, comprising:
   a first stacked structure, comprising:
   a first stacked portion disposed along a first direction;
   at least one second stacked portion connected with the first stacked portion and disposed along a second direction perpendicular to the first direction; and
   at least one third stacked portion connected with the first stacked portion and arranged alternately with the second stacked portion along the first direction; and
   a dielectric layer formed on the first stacked portion, the second stacked portion and the third stacked portion; and
   a second stacked structure facing the first stacked structure, the second stacked structure comprising:
   a fourth stacked portion disposed along the first direction;
   at least one fifth stacked portion connected with the fourth stacked portion and disposed along the second direction; and
   at least one sixth stacked portion connected with the fourth stacked portion and arranged alternately with the fifth stacked portion along the first direction;
   a plurality of first conductive lines disposed on a distal end of the second stacked portion and a distal end of the fifth stacked portion;
   an interval between one of the first conductive lines and the third stacked portion; and
   another interval between another one of the first conductive lines and the sixth stacked portion,
   wherein a width of the third stacked portion is smaller than a width of the second stacked portion along the second direction, a width of the sixth stacked portion is smaller than a width of the fifth stacked portion along the second direction, and the interval between the one of the first conductive lines and the third stacked portion is the same as the another interval between the another one of the first conductive lines and the sixth stacked portion.

2. The semiconductor structure according to claim 1, comprising a plurality of the second stacked portions and the third stacked portions, wherein intervals between the second stacked portions and the third stacked portions are the same along the first direction.

3. The semiconductor structure according to claim 1, wherein the second stacked portion includes a first end and a second end opposite to the first end, and the first end is connected with the first stacked portion.

4. The semiconductor structure according to claim 1, wherein
   the first stacked portion includes a first upper surface;
   the second stacked portion includes a second upper surface, a first side surface and a second side surface opposite to the first side surface;
   the third stacked portion includes a third upper surface, a third side surface and a fourth side surface opposite to the third side surface;
   the third side surface faces the second side surface, and
   the dielectric layer is disposed on the first upper surface, the second upper surface, the third upper surface, the first side surface, the second side surface, the third side surface and the fourth side surface.

5. The semiconductor structure according to claim 4, further comprising:
   a plurality of conductive islands disposed on the dielectric layer, wherein the conductive islands are disposed on the second upper surface, the first side surface, the second side surface, the third side surface and the fourth side surface, upper surfaces of the conductive islands are aligned with each other, and adjacent two of the conductive islands are separated with each other.

6. The semiconductor structure according to claim 5, wherein the conductive islands disposed on the third side surface and the fourth side surface are insulated from each other by the dielectric layer on the third stacked portion.

7. The semiconductor structure according to claim 1, further comprising:
   a first interval between the second stacked portion and the third stacked portion along the first direction; and
   a second interval between the fifth stacked portion and the sixth stacked portion along the first direction, wherein the second interval is the same as the first interval.

8. The semiconductor structure according to claim 1, wherein the fifth stacked portion corresponds to the third stacked portion, and the sixth stacked portion corresponds to the second stacked portion.

9. The semiconductor structure according to claim 1, wherein the first stacked structure comprises semiconductor strips and insulating strips stacked alternately, and the semiconductor strips are separated from each other by the insulating strips.

10. A semiconductor structure, comprising:
    a first stacked structure, comprising:
    a first stacked portion;
    at least one second stacked portion perpendicular to the first stacked portion;
    at least one third stacked portion perpendicular to the first stacked portion and arranged alternately with the second stacked portion;
    a second stacked structure, comprising:
    a fourth stacked portion parallel with the first stacked portion;
    at least one fifth stacked portion perpendicularly connected with the fourth stacked portion and corresponding to the third stacked portion; and
    at least one sixth stacked portion perpendicularly connected with the fourth stacked portion and corresponding to the second stacked portion; and
    a dielectric layer disposed on the second stacked portion, the third stacked portion, the fifth stacked portion and the sixth stacked portion;

a plurality of first conductive lines disposed on a distal end of the second stacked portion and a distal end of the fifth stacked portion;

an interval between one of the first conductive lines and the third stacked portion; and another interval between another one of the first conductive lines and the sixth stacked portion, wherein the interval between the one of the first conductive lines and the third stacked portion is the same as the another interval between the another one of the first conductive lines and the sixth stacked portion.

11. The semiconductor structure according to claim 10, further comprising:

a plurality of conductive islands disposed between the second stacked portion and the third stacked portion, and disposed between the fifth stacked portion and the sixth stacked portion.

12. The semiconductor structure according to claim 11, wherein the conductive islands disposed on both sides of the third stacked portion are insulated from each other by the dielectric layer on the third stacked portion, and the conductive islands disposed on both sides of the sixth stacked portion are insulated from each other by the dielectric layer on the sixth stacked portion.

13. The semiconductor structure according to claim 10, further comprising:

a plurality of second conductive lines disposed between the second stacked portion and the fifth stacked portion.

\* \* \* \* \*